United States Patent
Seeber et al.

(10) Patent No.: US 6,605,775 B1
(45) Date of Patent: Aug. 12, 2003

(54) FLOATING RADIO FREQUENCY TRAP FOR SHIELD CURRENTS

(75) Inventors: Derek Seeber, Wauwatosa, WI (US); Ashok Menon, Milwaukee, WI (US); Jovan Jevtic, West Allis, WI (US)

(73) Assignee: IGC-Medical Advances, Inc., Milwaukee, WI (US)

(*) Notice: Subject to any disclaimer, the term of this patent is extended or adjusted under 35 U.S.C. 154(b) by 0 days.

(21) Appl. No.: 10/145,229

(22) Filed: May 13, 2002

(51) Int. Cl.[7] ................................................. H05K 9/00
(52) U.S. Cl. ...................... 174/35 C; 174/36; 439/607; 439/527
(58) Field of Search ..................... 174/35 R, 35 C, 174/36; 361/816, 818; 439/271, 527, 607, 609, 610

(56) References Cited

U.S. PATENT DOCUMENTS 5,631,443 A * 5/1997 Scrimpshire et al. ..... 174/35 R
5,683,434 A * 11/1997 Archer .......................... 607/36
6,380,482 B1 * 4/2002 Norte et al. ............... 174/35 R

FOREIGN PATENT DOCUMENTS

JP 03268397 A * 11/1991 ............. H04K/9/00
JP 05137225 A * 6/1993 ............. H02G/3/04

* cited by examiner

Primary Examiner—Dean A. Reichard
Assistant Examiner—Carmelo Oliva
(74) Attorney, Agent, or Firm—Quarles & Brady LLP

(57) ABSTRACT

A floating shield current trap provides first and second concentric tubular conductors electrically connected to provide a resonance-induced high impedance of current flow in a path consisting of the inner and outer conductors and their junctions thereby suppressing coupled current flow on a shield of a conductor contained within the first inner tubular conductor.

16 Claims, 3 Drawing Sheets

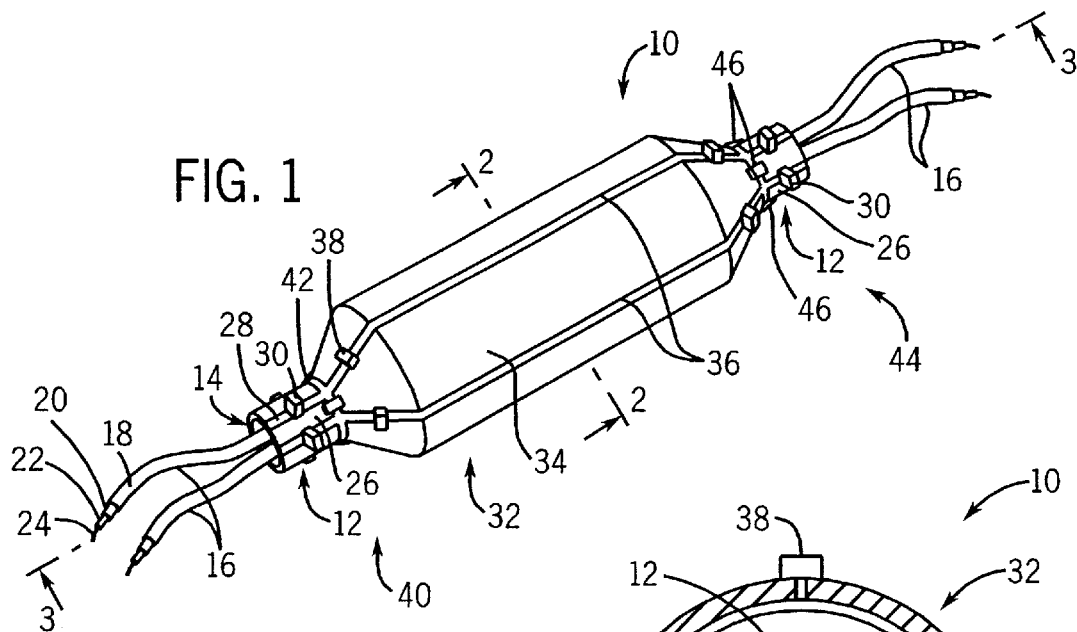
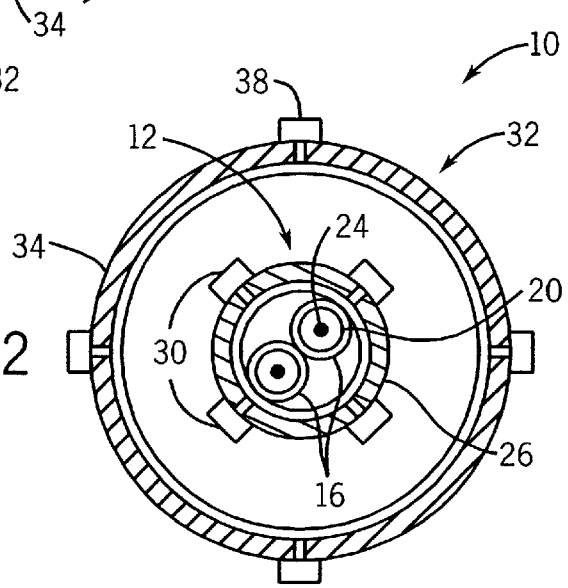
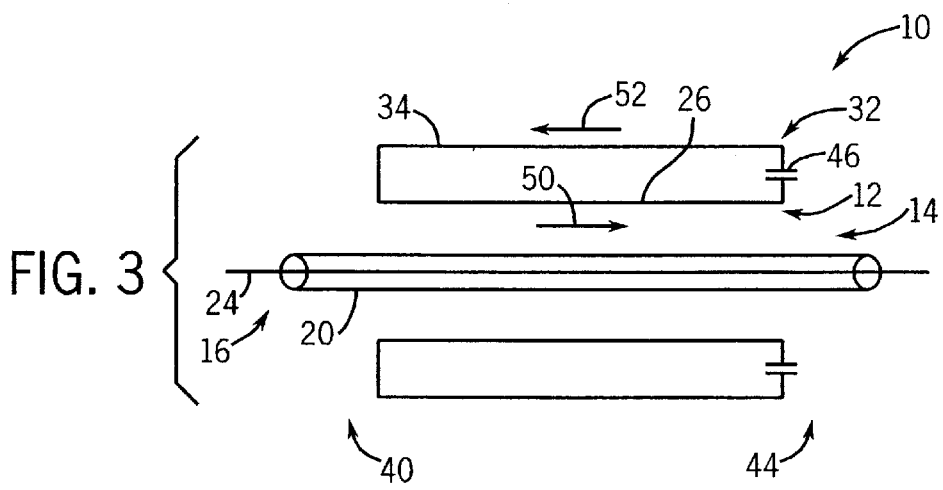

US 6,605,775 B1

FLOATING RADIO FREQUENCY TRAP FOR SHIELD CURRENTS

CROSS-REFERENCE TO RELATED APPLICATIONS

STATEMENT REGARDING FEDERALLY SPONSORED RESEARCH OR DEVELOPMENT

BACKGROUND OF THE INVENTION

Electrical conductors used for transmitting signals that may be susceptible to external electromagnetic noise often employ a center conductor surrounded by a conductive shield. The shield is grounded to prevent external electric fields from influencing the signal on the central conductor. A common "coaxial cable" shielded conductor, used for radio-frequency signals, employs a braided shield surrounding a central multi-strand conductor separated from the braided shield by an insulator of predetermined diameter and dielectric properties. The braded shield is surrounded in turn by a second insulator that protects the shield from damage or electrical contact with other conductors.

In applications where there are intense external electrical/magnetic fields, for example, in magnetic resonance imaging (MRI), significant current may be induced in the shield causing failure of the shielding effect and possibly damage to the shield and its adjacent insulation from heating. One method of reducing shield current is with ferrite "beads" which fit over the shield to resistively damp eddy currents induced by the shield currents. It is also known to reduce such shield currents by creating an S-trap in which the coaxial cable is wound in a first direction and then optionally a second direction about a cylindrical form to produce a self-inductance among the coils of each winding set. A capacitance is connected in parallel with the inductance (by attaching leads of a capacitor to the shield at separated points in each winding) providing parallel resonant circuits tuned to the particular frequency of the offending external radio frequency field. The tuning provides the shield with a high impedance at the frequency of the interference, resisting current flow at this frequency, while the counter-winding reduces inductive coupling of the trap to the noise.

While the S-trap may successfully reduce current flow in the shield, it requires additional cable length for the windings and thus may contribute to a loss of signal strength and may introduce an undesirable phase change in the signal. Further, manufacture of the S-trap is cumbersome, requiring modification of the coaxial cable including a removal of portions of its external insulation for attachment of a capacitor. The fixed position of the S-trap makes it difficult to adjust the S-trap to a location on the shield having maximum current, as is desirable. Ferrite beads are unsuitable in areas of intense magnetic fields, such as are found in magnetic resonance imaging machines.

BRIEF SUMMARY OF THE INVENTION

The present invention reduces currents in the shield of a cable (for example, a coaxial cable) without electrical attachment to the cable. The invention therefore may be easily added (or removed) from the shielded cable and adjusted in position along the length of the cable. The invention does not increase the length of the cable and therefore does not increase cable losses and undesired phase changes caused by increased cable length.

Specifically, the invention provides a shield current trap having a first and second concentric tubular conductor electrically connected to provide a resonance-induced high impedance to current flow in a path consisting of the inner and outer conductors and their junctions.

The summary in this application is not intended to define the scope of the invention for which purpose claims are be provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

BRIEF DESCRIPTION OF THE DRAWINGS

FIG. 1 is a perspective view of a shield current trap of the present invention as fit over two coaxial cables, showing the invention's concentric outer and inner conductive structures;

FIG. 2 is a cross-sectional view of the shield current trap of FIG. 1 taken along lines 2—2 showing the successive layers of conductors of the outer conductive structure, the inner conductive structure and the shield of the coaxial cables;

FIG. 3 is a schematic representation of the shield current trap of FIG. 1 taken in cross section along lines 3—3 of FIG. 1 as positioned around a single coaxial cable showing the suppression of shield currents through tuning of the inner and outer conductive structures;

DETAILED DESCRIPTION OF THE PREFERRED EMBODIMENT

Figure 4:
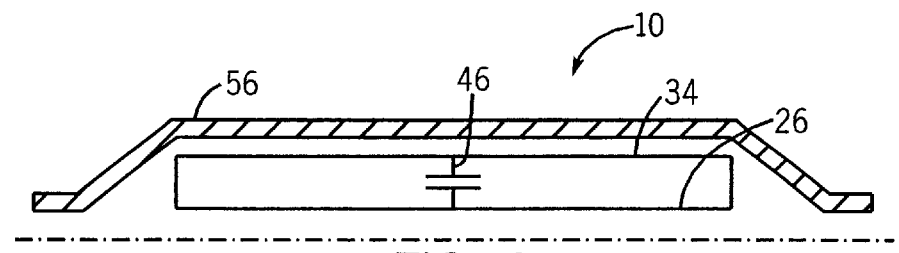
FIG. 4 is a fragmentary, schematic, cross-section similar to FIG. 3 showing an alternative embodiment in which high voltages on the outer conductive structure are displaced toward the center of the current trap to be covered by an insulating outer housing.

Referring now to FIGS. 1 and 2, a shield current trap 10 of the present invention may include a tubular inner portion 12 having a central lumen 14 receiving one or more coaxial cables 16 of conventional design. The size of the central lumen 14 may be varied depending on how many cables are to be accepted. Each coaxial cable, known in the prior art, includes an outer insulating sheath 18 fitting around a braided, rigid, or similar shield 20 covering an insulator 22 having a central signal-carrying conductor 24.

The tubular inner portion 12 of the shield current trap 10 may be insulating and have a conductive surface, typically of copper foil, to produce an inner conductor 26 extending along its entire surface, broken only by optional longitudinal slots 28 intended to prevent circumferential eddy currents at low frequencies produced, for example, by gradient magnetic fields used in the MRI machine. The foil may be aligned by shallow longitudinal grooves cut in the outer surface of the tubular inner portion 12. The slots 28 are optional and are unnecessary if the problem of eddy currents is not significant in the particular application. The tubular inner portion 12 may have an arbitrary cross section not limited to circular but including rectangular and other shapes. Bridging capacitors 30 are attached across the slots 28 to provide a conductive path for radio frequencies and thereby a substantially unbroken conductor at the frequency of the expected interference. For a typical MRI machine, the expected radio-frequency interference will be at approximately 64 megahertz, but the invention is not limited to a particular frequency range.

Fitting around the tubular inner portion 12 of the shield current trap 10 is a large diameter tubular outer portion 32 whose outer surface is conductive to provide an outer conductor 34. Again, the tubular outer portion need not have a circular cross section. The outer conductor 34 is broken by longitudinal slots 36 (like the inner conductor 26 of the tubular inner portion 12) preventing low-frequency eddy currents and bridged by optional radio frequency conducting capacitors 38 to provide a substantially unbroken radio frequency conductor. Again, the outer conductor 34 may be applied as foil aligned by means of shallow longitudinal grooves cut in the outer surface of the tubular outer portion 23. The slots 36 are particularly useful when low-frequency magnetic fields will be present as is the case with magnetic resonance imaging.

In one embodiment, the tubular outer portion 32 tapers inward while maintaining its cylindrical aspect at either end of the tubular outer portion 32 to approach the tubular inner portion 12. At a first end 40 of the shield current trap 10, the outer conductor 34 of the tubular outer portion 32 is electrically connected to the inner conductor 26 of the tubular inner portion 12 by capacitors 42. These capacitors 42 are selected to be large enough to provide essentially no impedance at the expected radio frequency of the interference.

At a second, opposing end 44 of the shield current trap 10, the outer conductor 34 of the tubular outer portion 32 is also attached to the inner conductor 26, but through capacitors 46, selected to tune the shield current trap 10 to resonance at the frequency of the expected external interference. The resonance is "parallel resonance" creating a high impedance to longitudinal current flow traveling in a path in a first direction in the outer conductor 34 of the tubular outer portion 32 and in the opposite direction in inner conductor 26 of the tubular inner portion 12. Capacitors 46 are selected to adjust the path length in this path to be substantially equal to an odd multiple of one-quarter of the wavelength of the expected external interfering signal. This condition creates a high impedance resisting current flow at the frequency of the expected interfering signal. In the event that the expected interfering signal is comprised of many frequencies, as will often be the case, the adjustment of the electrical length of the path may be made with respect to a dominant frequency component or multiple traps 10 may be used. The suppression of shield current flow is accomplished by proper selection of the dimensions of the inner conductor 26 and the outer conductor 34, or those dimensions and the value of capacitor 46 so that a high impedance is created in those conductors at the resonant frequency of the external interfering field, preventing current 52.

Significantly, this high impedance and suppression of current 52 requires no direct electrical connection between elements of the shield current trap 10 and the coaxial cable 16 such as would require cutting the outer shield away from the coaxial cable 16.

Referring now to FIG. 4, the path formed by outer conductor 34 and inner conductor 26 may be broken into multiple (in this example: two) sub-paths by joining outer conductor 34 and inner conductor 26 through low impedance connections at the two opposite ends of the shield current trap 10 and joining outer conductor 34 and inner conductor 26 at midpoints with capacitor 46. Again, the value of the capacitor 46 is selected so that each sub-path has an electrical length being an odd multiple of one quarter of the wavelength of the expected interfering external signal. In this case, high voltages on the outer conductor 34 are displaced toward the center of the shield current trap 10. An insulating covering 56 is placed around the outer conductor 34 to protect the user from these voltages. Clearly, an arbitrary number of sub-paths may be created in this manner. The insulating covering 56 may conform generally to the outer conductor 34 and the inner conductor 26, the extent of the inner conductor 26 is exposed at either end of the shield current trap 10, so as to fully insulate all exposed conductive surfaces of the shield current trap 10.

Figure 5:
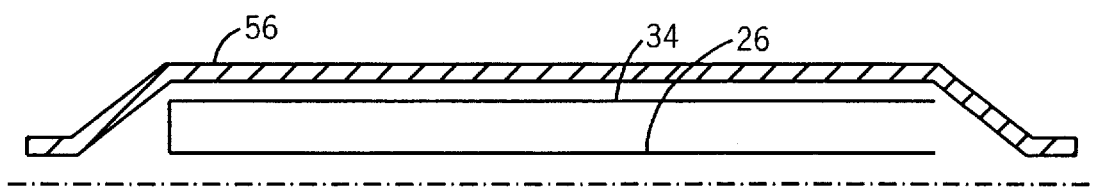
FIG. 5 is a figure similar to that of FIG. 4 showing yet an alternative embodiment eliminating the tuning capacitor.

Referring to FIG. 5 it will be understood that the path formed by outer conductor 34 and inner conductor 26 may be sized to be of the desired electrical length (an odd multiple of one quarter of the wavelength of the interfering signal) without the need for the capacitor 46 simply by adjusting the actual length of the inner and outer conductors 26 and 34. This generally will increase the length of the shield current trap 10 but may be appropriate for certain applications.

It will be understood to those of ordinary skill in the art that the paths of FIGS. 3–5 may be repeated an arbitrary number of times and that further each separate path may be tuned independently to address a different frequency of interference.

The ability of the shield current trap 10 to operate without direct electrical connection to the contained coaxial cable 16 allows the shield current trap 10 to be installed or removed freely at any time by simply threading the coaxial cable 16 through the lumen 14 of the tubular inner portion 12. In certain situations, however, threading the coaxial cable 16 through the tubular inner portion 12 will be obstructed by electrical connectors or the like attached to the coaxial cable 16. Accordingly, the present invention contemplates that the shield current trap 10 may be constructed in two halves split longitudinally along an axis of symmetry.

Figure 6:
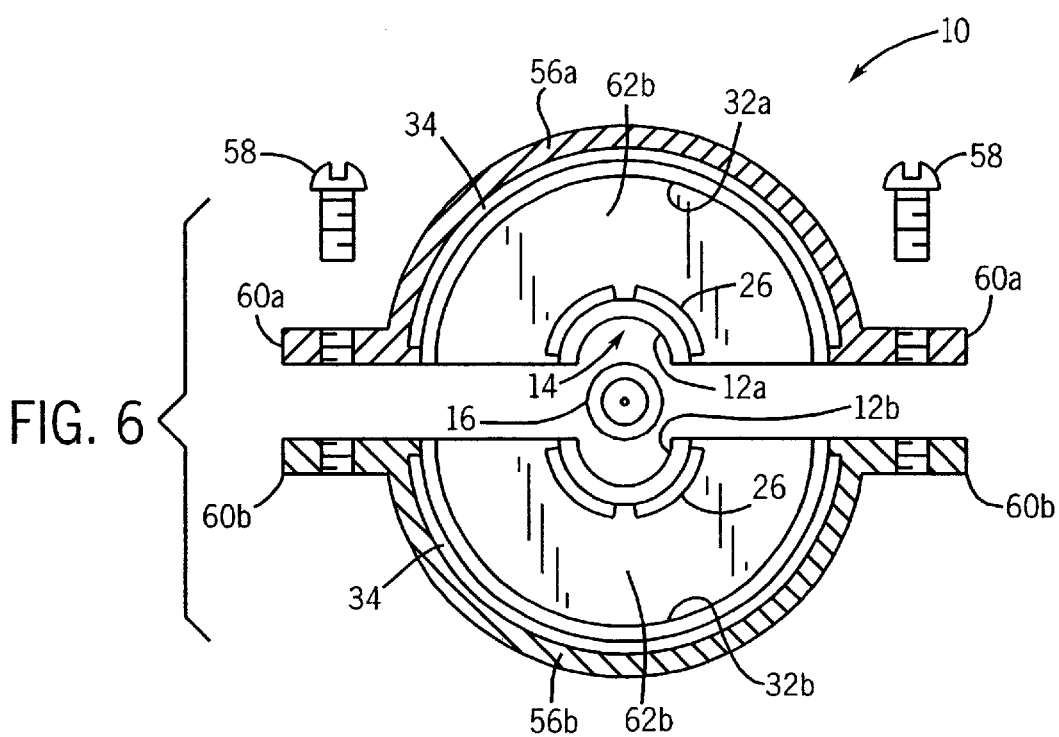
FIG. 6 is a cross sectional view similar to FIG. 2 showing an embodiment in which the shield current trap is assembled from two halves so that it may be placed about a shielded cable without a threading of the cable through the shield current trap.

Referring now to FIG. 6, the tubular inner portion 12 may be split into two hemi-cylindrical portions 12a and 12b. Likewise, the tubular outer portion 32 (including the tapered ends) may be split into two corresponding hemi-cylindrical portions 32a and 32b and the insulating cover may be split into two hemi-cylindrical covers 56a and 56b. Each of hemi-cylindrical covers 56a and 56b may include transversely extending the tabs 60a and 60b, respectively, abutting along a separation plane when the two halves of the shield current trap 10 are assembled together. Clearly, this principle can be extended to a splitting of the tubular inner and outer portions 12 and 32 into more than two pieces, as well.

Machine screws 58 fabricated from nylon or other non-ferromagnetic materials, or the like (for example, interfitting snaps molded as integral parts of the housing) may be used to attach the tabs 60a and 60b together about the coaxial cable 16 without the need to thread the cable 16 through the lumen 14. Alternatively, but not shown, the machine screws 58 may be received within bores in the cylindrical body of the shield current trap 10 eliminating the need for the tabs 60a and 60b.

Dielectric spacers 62a and 62b may be used to support the inner tubular portions 12a and 12b with respect to the outer tubular portions 32a and 32b, the latter of which are held by the insulating housings 56a and 56b. Alternatively, dielectric spacers 62a and 62b are eliminated by direct mechanical connection in the tapered portion of the housing 56a and 56b to the inner tubular portions 12a and 12b as may be better understood by also viewing FIGS. 4 and 5.

Figure 7:
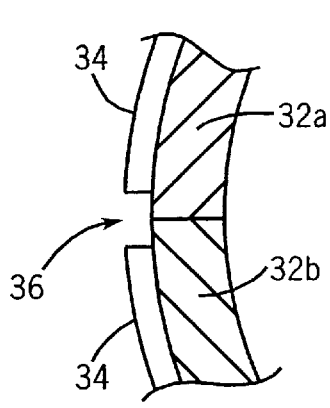
FIG. 7 is a fragmentary cross-sectional view of an interface between conductive structures of the embodiment of FIG. 6 in which the separation of the halves is along longitudinal eddy current reducing slots.
Figure 8:
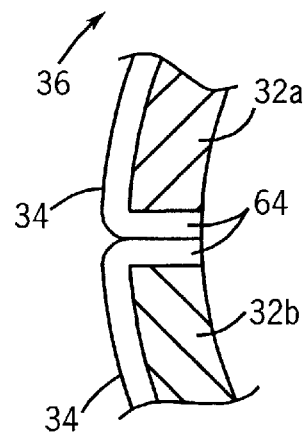
FIG. 8 is a figure similar to FIG. 7 in which the conductive structures of FIG. 6 are connected by electrically conductive fingers forming a releasable electrical connector.

Referring now to FIG. 7 the shield current trap 10 may be separated along a longitudinal slot 36 in the outer conductor 34 (and aligned slots 28 in the inner conductor 26) to prevent the need for electrical interconnection of the halves. Alternatively, as shown in FIG. 8, outer conductor 34 (and corresponding inner conductor 26) may include conductive fingers 64 pressed together at the interface between the halves of the shield current trap 10 when they are assembled providing electrical interconnection. In this latter case, eddy current reducing slots 36 may be displaced away from the parting line of the shield current trap 10. The embodiment of FIG. 8 allows use of bridging capacitors 30 across the gaps provided to reduce any currents.

In an alternative embodiment, not shown, the halves of the shield current trap 10 may be hinged to open at only one edge.

Figure 9:
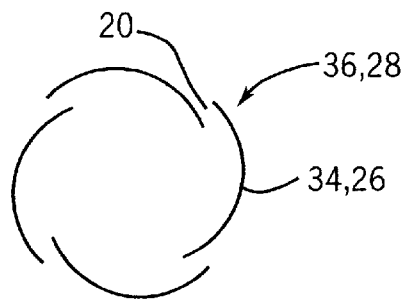
FIG. 9 is a simplified cross section along lines 2—2 showing an alternative method of creating eddy current suppressing slots in the conductors of the inner and outer conductive structures.

Referring now to FIG. 9, in an alternative embodiment, the slots 36 or 28 may be formed not by circumferential gaps in the outer conductor 34 and inner conductor 26, respectively, but by radial gaps 70 formed by overlap of the outer conductors 34 and inner conductors 26. Overlap in the outer conductors 34 or inner conductors 26 may be provide for the optional radio frequency conducting capacitors 38 as well or discrete capacitors may be placed across these gaps.

Figure 10:
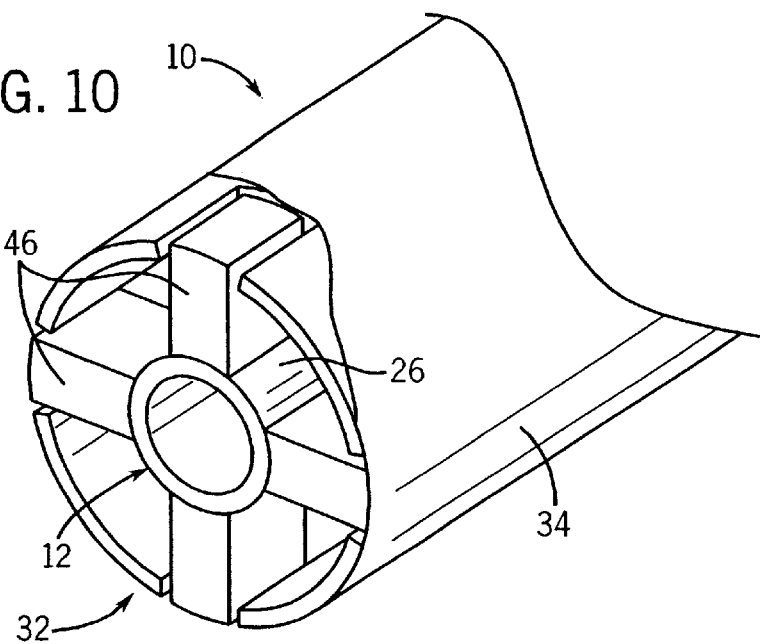
FIG. 10 is a fragmentary perspective view of an alternative embodiment of the inner and outer conductive structures showing a simplified construction technique and elimination of eddy current suppressing slots.

Referring to FIG. 10, the slots 28 and 36 may be eliminated altogether when eddy currents are not a problem. The tapering of the outer conductor 34 may be avoided by using the tuning capacitors 46 to connect the inner and outer conductors 26 and 34.

In use, the shield current trap 10 may be slid along the cable 16 so as to be located near a point of maximum shield current and thereby to have greatest effect. Such adjustment is not possible with prior art S-traps.

It is specifically intended that the present invention not be limited to the embodiments and illustrations contained herein, but that modified forms of those embodiments including portions of the embodiments and combinations of elements of different embodiments also be included as come within the scope of the following claims. For example, although the preferred embodiment shows cylindrical tubes, other cross-sections are also suitable including, for example, squares. Further, the tubes and conductors may be flexible using braiding or a bellows configuration to produce a flexible shield current trap 10.

We claim:

1. A shield current trap for use with a shielded cable having an outer shield surrounding at least one inner conductor, the shield current trap comprising:
   (a) a first tubular conductor extending longitudinally between a first and second end for receiving at least a portion of the shield of the shielded cable while remaining insulated from the shield of the shielded cable;
   (b) a second tubular conductor extending longitudinally between the first and second end and surrounding the first tubular conductor, wherein the first and second tubular conductors are electrically connected at the first and second ends to provide at least one current path having an electrical length that is an odd multiple of one quarter of a wavelength of an external electrical interference signal;
   whereby shield currents produced by the electrical interference signal are suppressed.

2. The shield current trap of claim 1 wherein a tuning capacitor joins the first and second tubular conductors to set the electrical length of the path to the odd multiple of one quarter of a wavelength of the external electrical interference signal.

3. The shield current trap of claim (2) wherein the tuning capacitor joins the first and second tubular conductor at the first end.

4. The shield current trap of claim (2) wherein the tuning capacitor joins the first and second tubular conductor at a point between the first and second ends.

5. The shield current trap of claim 1 wherein at least one of the first and second tubular conductors includes longitudinal slots inhibiting the flow of eddy currents.

6. The shield current trap of claim 5 wherein the longitudinal slots are bridged by capacitances providing a low impedance path at frequencies matching at least one frequency of the electrical interference signal.

7. The shield current trap of claim 1 including further an insulating housing fitting over the first and second tubular conductors.

8. A shield current trap for use with a shielded cable having an outer shield surrounding at least one inner conductor, the shield current trap comprising:
   (a) a first split tubular conductor extending longitudinally between a first and second end, (b) a second split tubular conductor extending longitudinally between the first and second end and surrounding the first split tubular conductor, wherein the first and second tubular conductor are electrically connected at the first and second ends to provide at least one current path having an electrical length that is an odd multiple of one quarter of a wavelength of an external electrical interference signal;
   wherein the first and second split tubular conductor are openable to receive a portion of the shield of the shielded cable and closable to surround the portion of the shield of the shielded cable while remaining insulated from the shield of the shielded cable;
   whereby shield currents produced by the electrical interference signal are suppressed.

9. The shield current trap of claim 8 wherein the first and second tubular conductors include longitudinal slots inhibiting the flow of eddy currents and wherein the first and second tubular conductors are openable to separate along the longitudinal slots.

10. The shield current trap of claim 8 wherein the first and second tubular conductors include electrical connectors releasably connecting portions of the first and second tubular conductors and the first and second tubular conductors are openable across the electrical connectors.

11. The shield current trap of claim 8 wherein a tuning capacitor joins the first and second split tubular conductors to set the electrical length of the path to the odd multiple of one quarter of a wavelength of the external electrical interference signal.

12. The shield current trap of claim (11) wherein the tuning capacitor joins the first and second split tubular conductor at the first end.

13. The shield current trap of claim (11) wherein the tuning capacitor joins the first and second split tubular conductor at a point between the first and second ends.

14. The shield current trap of claim 8 wherein at least one of the first and second split tubular conductors includes longitudinal slots inhibiting the flow of eddy currents.

15. The shield current trap of claim 14 wherein the longitudinal slots are bridged by capacitances providing a low impedance path at frequencies matching at least one frequency of the electrical interference signal.

16. The shield current trap of claim 8 including further a split insulating housing fitting over the first and second split tubular conductors.

* * * * *